United States Patent [19]

Hagelin

[11] Patent Number: 4,682,100
[45] Date of Patent: Jul. 21, 1987

[54] METHOD OF MEASURING A DC CURRENT OR A LOW-FREQUENCY AC CURRENT

[75] Inventor: Frank H. Hagelin, Alvjso, Sweden

[73] Assignee: Telefonaktiebolaget LM Ericsson, Stockholm, Sweden

[21] Appl. No.: 853,709

[22] Filed: Apr. 18, 1986

Related U.S. Application Data

[62] Continuation-in-part of Ser. No. 626,876, June 29, 1984, abandoned.

[30] Foreign Application Priority Data

Dec. 21, 1982 [SE] Sweden .............................. 8207304
Dec. 14, 1983 [WO] PCT Int'l Appl. ... PCT/SE83/00450

[51] Int. Cl.$^4$ ............................................ G01R 19/10
[52] U.S. Cl. ................. 324/117 R; 324/117; 324/127
[58] Field of Search ................ 307/511, 409–413; 324/83 D, 83 FE, 99 R, 99 D, 117 R, 127; 328/133, 155–157; 330/9

[56] References Cited

U.S. PATENT DOCUMENTS

| | | | |
|---|---|---|---|
| 2,923,820 | 2/1960 | Liguori et al. | 324/83 FE |
| 3,023,370 | 2/1962 | Waller | 324/83 FE |
| 3,461,382 | 8/1969 | Anderson | 324/83 FE |
| 3,989,931 | 11/1976 | Phillips | 324/83 D |
| 4,198,595 | 4/1980 | Milkovic | 324/127 |
| 4,314,200 | 2/1982 | Marek . | |
| 4,438,393 | 3/1984 | Moskalik et al. | 324/83 D |
| 4,471,299 | 9/1984 | Elmis | 328/133 |
| 4,520,321 | 5/1985 | Nakatsugawa et al. | 328/133 |

FOREIGN PATENT DOCUMENTS

| | | | |
|---|---|---|---|
| 0266053 | 3/1970 | U.S.S.R. | 324/99 R |
| 0748280 | 7/1980 | U.S.S.R. | 324/83 D |

Primary Examiner—Reinhard J. Eisenzopf
Assistant Examiner—W. Burns
Attorney, Agent, or Firm—Roberts, Spiecens & Cohen

[57] ABSTRACT

Measuring a DC or a low frequency AC current by feeding the current to be measured through the primary winding of a transformer, whereby a first flux is generated in the transformer and generating a modulating voltage and also phase shifting the modulating voltage. The phase shifted modulated voltage is applied across the secondary winding of the transformer with an amplitude so as to saturate the core. The phase difference between the modulating voltage and the phase shifted modulating voltage is monitored while feeding a compensating current of increasing amplitude through the secondary winding until the phase difference is zero. The amplitude of the compensating current at zero phase difference is a representation of the current to be measured.

4 Claims, 2 Drawing Figures

METHOD OF MEASURING A DC CURRENT OR A LOW-FREQUENCY AC CURRENT

This application is a continuation-in-part of application Ser. No. 626,878, filed June 29, 1984 now abandoned.

TECHNICAL FIELD

The present invention relates to a method of transforming a DC current or a low-frequency AC current with the aid of a transformer having a first and a second winding where the current is supplied to the first winding, and an apparatus for carrying out the method.

BACKGROUND ART

In applications such as safety systems for railway signals controlled by computerized switchgear, there is a need of galvanically insulated measurement of the effective value of the lamp currents.

Known solutions for enabling such measurement with the aid of a transformer are both complicated and expensive, however.

DISCLOSURE OF INVENTION

An object of the present invention is to provide a simple and inexpensive method of transforming a DC current or a low-frequency AC current with the aid of a transformer, and an apparatus for carrying out the method.

DESCRIPTION OF DRAWING

The invention will be described below with reference to the accompanying drawing wherein.

PREFERRED EMBODIMENT

Figure 1:
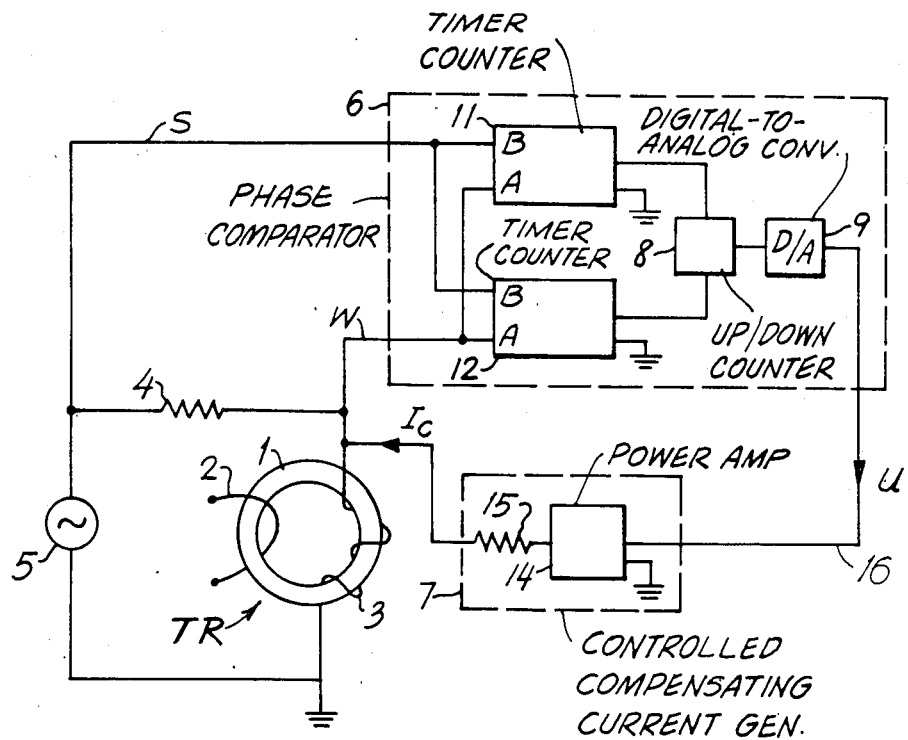
FIG. 1 is apparatus for performing the invention.

An embodiment of an apparatus in accordance with the invention is illustrated in the FIG. 1 and is intended for transforming a DC or low-frequency AC current with the aid of a transformer. The transformer has a core 1 assumed to be a toroidally shaped ferrite core in the illustrated embodiment, through the central opening of which there is inserted the primary winding in the form of a wire. The core also carries a secondary winding 3 having a predetermined number of turns for obtaining a predetermined transformation ratio in the transformer.

The DC or low-frequency AC current which is to be transformed is applied to the transformator primary winding 2 in a manner not more fully illustrated.

A modulating voltage source 5 is connected across the secondary winding 3 of the transformer TR, in series with a phase-shifting network, which is a resistor 4 in the illustrated embodiment. Via the resistor 4 the source 5 is adapted for applying a modulating voltage across the secondary winding 3 with an amplitude such that the transformator core 1 is saturated. By "low-frequency current" is intended in this context a current having a frequency amounting to at most about 1/10 of that of the modulating voltage source 5. This in turn is between 5 and 10 kHz for a core diameter of about 8 mm.

The current through the primary winding 2 causes a magnetic flux in the transformer core 1, and according to the invention this flux is compensated by a current supplied to the secondary winding 3 until the flux in the core 1 becomes equal to zero, the compensating current through the secondary winding 3 then constituting a copy of the current in the primary winding 2 transformed over at the transforming ratio of the transformer.

In accordance with the invention, the compensating current is achieved in the following manner:

A phase comparator 6 (more fully described below) has both its inputs connected to the connection point for the modulating voltage source 5 and the resistor 4, and also to the connection point for the resistor 4 and the transformer secondary winding 3. The comparator 6 measures, at two consecutive zero crossings, the separation in phase between the voltage of the modulating voltage source 5 and the voltage across the transformer secondary winding 3. The comparator 6 is further adapted to generate a control signal in response to the difference between both these measured separations in phase. This control signal, which is thus proportional to the difference between the separation phase in two consecutive zero crossings, is applied via line 16 to a controlled compensating current generator 7, having an output connected to the connection point for the transformer secondary winding 3 and the resistor 4.

The compensating current generator 7 is adapted for feeding a current, in response to the mentioned control signal on line 16 for compensating the flux in the core 1 caused by the current in the primary winding 2, until the difference between two consecutive, measured separations in phase is zero. When such is the case, the current from the compensating current generator 7 constitutes a copy, transformed over with the transforming ratio, of the current in the primary winding 2. This current may then be measured in a manner known per se for obtaining measure of the current in the primary winding 2.

Figure 2:
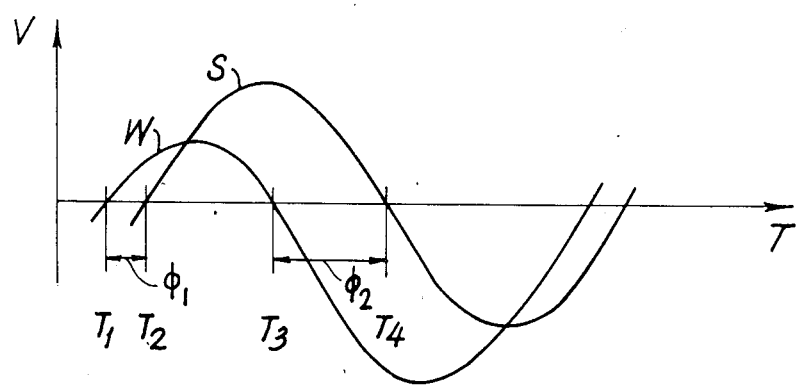
FIG. 2 is a waveform diagram for explaining the operation of the circuit of FIG. 1.

More particularly, FIG. 2 is a timing diagram of the voltage from the source 5, curve S, and the voltage across the winding 3 curve W. In this diagram the time is denoted by T and the voltage is denoted by V. The curve W is displaced downwards due to the magnetic flux in the core 1 from the primary winding 2. The separations in phase are denoted by $\phi_1$ and $\phi_2$.

In FIG. 1 is shown more in detail the apparatus in accordance with the invention for the phase comparator 6 and the compensating current generator 7. The phase comparator has two digital time-counters 11 and 12 (e.g. Hewlett Packard 5316 A) with inputs A and B. The time-counters are connected to an up-down counter 8, which is connected to a digital-to-analog converter 9. The inputs A and B of the time counter 11 are adjusted to be triggered at a zero crossing of an increasing voltage. The voltage from the winding 3, curve W, will start the time-counter 11 at the time $T_1$ and the voltage from the source 5, curve S, will stop it at $T_2$ so that the time difference $T_2-T_1$, corresponds to $\phi_1$. The inputs A and B of the time-counter 12 are adjusted to be triggered at a zero-passage of a decreasing voltage so that, in a corresponding manner, the time difference $T_4-T_3$ corresponds to $\phi_2$. The up-down counter 8 counts the difference $\phi_2-\phi_1$ and the A/D Converter 9 converts the digital results into the analog control signal (U). This signal is connected via line 16 to the compensating current generator 7, which has a power amplifier 14 (e.g. Philips P M 5175) and a resistor 15. The generator 7 feeds an output current ($I_c$) in the winding 3 to compensate the flux in the core 1. It should be noted that a conventional arithmetic unit in the subtraction mode can be used instead of up/down counter 8. A DC or a low-frequency AC current may thus be transformed in a simple manner, with the aid of the apparatus in accordance with the invention.

What is claimed is:

1. Method of measuring a DC or a low frequency AC current comprising the steps of providing a transformer with a core about which there is wound a primary and a secondary winding, feeding the current to be measured through the primary winding, whereby a first flux is generated in the transformer, generating a modulating voltage, phase shifting the modulating voltage, applying the phase shifted modulating voltage across the secondary winding, and with an amplitude so as to saturate the core, measuring separations in phase between the modulating voltage and the phase shifted modulating voltage at two consecutive zero passages, and feeding a compensating current of increasing amplitude through the secondary winding until a measured difference between the two separations in phase is zero, the amplitude of the compensating current at zero difference in separation in phase being a representation of the current to be measured.

2. Apparatus for measuring a DC or a low frequency AC current comprising: A transformer having a core with a primary winding for receiving the current to be measured and a secondary winding; modulating-voltage generating means; phase shifting means connecting said modulating voltage means to said secondary winding whereby a phase shifted modulating voltage is applied to said transformer, the amount of phase shift being a function of flux in the core; phase comparator means measuring separations in phase between the modulating voltage and the phase-shifted modulating voltage at two consecutive zero passages for generating a control signal whose amplitude is a measure of difference between said two separations in phase; and controlled compensating current generating means for feeding a compensating current through said secondary winding to reduce said difference in said separation in phase until the amplitude of the compensating current causes a zero difference in said separation in phase, the amplitude of said compensating current for zero difference in separation in phase being a measure of the current through said primary winding as modified by a turns ratio of said windings.

3. The apparatus of claim 2 wherein said phase comparator means comprises a first time counter means for accumulating pulses at a given rate, said first time counter means having a first input for activating said first time counter means when a signal received thereby passes through zero voltage in a first direction and a second input for deactivating said first time counter means when a signal received thereby passes through zero voltage in said first direction and an output; a second time counter means for accumulating pulses at said given rate, said second time counter means having a first input for activating said second time counter means when a signal received thereby passes through zero voltage in a second direction and a second input for deactivating said second counter means when a signal received thereby passes through zero voltage in said second direction; means connecting the inputs of said first time counter means to receive the modulating voltage and phase shifted modulating voltage; means connecting the inputs of said second time counter means to receive the modulating voltage and the phase shifted modulating voltage; and control signal generating means for generating said control signal as a function of a difference in counts accumulated by time counter means.

4. The apparatus of claim 3 wherein said control signal generating means comprises an up-down counter means having inputs connected to said time counter means and an output means for yielding a digital value equal to said difference in counts and a digital to analog converter means connected to said output means.

* * * * *